(12) United States Patent
Nishimura (10) Patent No.: US 6,853,580 B2
(45) Date of Patent: Feb. 8, 2005

(54) MAGNETORESISTIVE ELEMENT AND MRAM USING THE SAME

(75) Inventor: Naoki Nishimura, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/098,117

(22) Filed: Mar. 15, 2002

(65) Prior Publication Data

US 2003/0002330 A1 Jan. 2, 2003

(30) Foreign Application Priority Data

Mar. 19, 2001 (JP) ........................................ 2001-078471

(51) Int. Cl.$^7$ .......................... G11C 11/14; G11C 11/15
(52) U.S. Cl. ......................... 365/158; 365/171; 365/173
(58) Field of Search .............................. 365/158, 171, 365/173, 207

(56) References Cited

U.S. PATENT DOCUMENTS

| 6,055,179 | A | 4/2000 | Koganei et al. | ............ 365/158 |
| 6,104,632 | A | 8/2000 | Nishimura | ................... 365/158 |
| 6,166,948 | A | 12/2000 | Parkin et al. | ............... 365/173 |
| 6,219,275 | B1 | 4/2001 | Nishimura | ................... 365/173 |
| 6,490,190 | B1 * | 12/2002 | Ramcke et al. | ............. 365/158 |
| 2001/0040819 | A1 * | 11/2001 | Hayashi et al. | ............. 365/158 |

FOREIGN PATENT DOCUMENTS

EP          0959475         11/1999
EP          1115164         7/2001

OTHER PUBLICATIONS

Scheuerlein et al., "A 10ns Read and Write Non–Volatile Memory Array Using a Magnetic Tunnel Junction and FET Switch in each Cell," IEEE International Solid–State Circuits Conference: Digest of Technical Papers, Feb. 8, 2000, pp. 128–129.*

* cited by examiner

Primary Examiner—Richard Elms
Assistant Examiner—J. H. Hur
(74) Attorney, Agent, or Firm—Fitzpatrick, Cella, Harper & Scinto (57) ABSTRACT

An offset of the switching magnetic field of a memory layer caused by a static magnetic field from a pinned layer in a magnetoresistive element used as a memory element is suppressed. A first magnetic layer magnetized perpendicularly to the film surface, an insulating layer, and a second magnetic layer magnetized perpendicularly to the film surface form the magnetoresistive element. The coercive force of the second magnetic layer is higher than that of the first magnetic layer. Upon the flow of current between the first magnetic layer and the second magnetic layer via the insulating layer N2, the resistance changes depending on the relative angle in magnetization between the two magnetic layers. A magnetic field applied from the second magnetic layer 2 to the first magnetic layer 1 is set smaller than the coercive force of the first magnetic layer 1.

13 Claims, 9 Drawing Sheets

STRAY MAGNETIC FIELD LEAKED FROM 2nd MAGNETIC LAYER 2

FIG. 11

STRAY MAGNETIC FIELD LEAKED FROM MAGNETIC LAYER 12

MAGNETORESISTIVE ELEMENT AND MRAM USING THE SAME

BACKGROUND OF THE INVENTION

1. Field of the Invention

The present invention relates to a magnetoresistive element applied to a nonvolatile memory or the like, and an MRAM using the magnetoresistive element.

2. Related Background Art

Recently, magnetic memory elements for storing information by using a magneto-resistance effect receive attention as high-density, high-response, nonvolatile solid-state memory elements. MRAMs (Magnetic Random Access Memories) attract attention as memory devices using magnetic memory elements. The magnetic memory element stores information by the magnetization direction of a magnetic layer, and can constitute a nonvolatile memory for semipermanently holding information. MRAMs are expected to be used as various memories such as information storage elements for a portable terminal and card. Especially an MRAM with a magnetic memory element using a spin tunneling magneto-resistance (TMR) effect can utilize a high-output characteristic obtained by the TMR effect. This MRAM also allows high-speed read, and its practical use is expected.

A magnetic memory element may have a structure comprised of a memory layer and reference layer. In general, the reference layer is a magnetic material layer whose magnetization direction is fixed or pinned in a specific direction. The memory layer is a layer for storing information, and is generally a magnetic layer capable of changing its magnetization direction by externally applying a magnetic field. The logic state of the memory element is determined by whether the magnetization direction within the memory layer is parallel to that within the reference layer. If these magnetization directions are parallel to each other because of the MR (Magneto-Resistance) effect, the resistance of the magnetic memory cell decreases, if these directions are not parallel, i.e., are antiparallel, the resistance of the memory cell increases. The logic state of the memory cell is determined by measuring its resistance.

Information is written in the memory cell of the MRAM by changing the magnetization direction within the memory layer by a magnetic field generated by flowing a current through a conductor. Written information is read out using an absolute detection method of detecting the absolute value of a resistance or a differential detection method of changing the magnetization direction of a detection layer in read.

The memory element must shrink in feature size for high integration degrees. Generally in a longitudinal magnetization layer, the spin curls at the film edge due to a demagnetizing field within the film surface along with the miniaturization. The memory element cannot stably store magnetic information. To prevent this problem, the present inventor has disclosed in U.S. Pat. No. 6,219,275 an MR element using a magnetic film (perpendicular magnetization film) magnetized perpendicular to the film surface. The perpendicular magnetization film is free from any curling even upon miniaturization. When this film is used as a memory element, it can sufficiently shrink in feature size to increase the density of the MRAM.

The MR element includes two magnetic layers stacked via a nonmagnetic layer. A stray magnetic field leaked from one magnetic layer is applied to the other magnetic layer. The magnetic field is kept applied even in the absence of an external magnetic field.

Figure 14A:
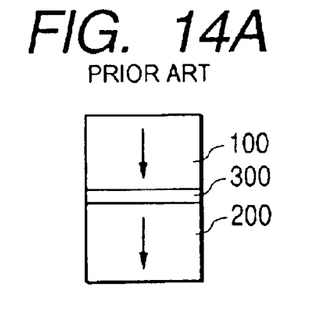
FIGS. 14A and 14B are sectional views showing a structure of the magnetoresistive element.
Figure 14B:
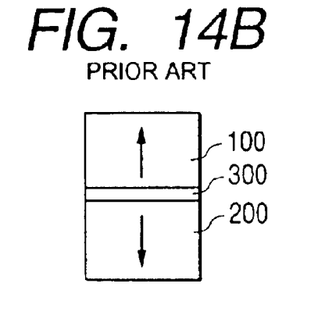

FIGS. 14A and 14B show examples of the magnetization direction of a TMR element having a perpendicular magnetization film. A magnetic film 100 and a magnetic film 200 higher in coercive force than the magnetic film 100 are stacked via a nonmagnetic film 300. In both the examples shown in FIGS. 14A and 14B, the magnetic film 200 is magnetized downward. The magnetic film 100 is magnetized downward in FIG. 14A, and upward in FIG. 14B. The magnetic film 200 is a pinned layer always magnetized downward. "0" is recorded in the state of FIG. 14A, and "1" is recorded in the state of FIG. 14B.

Figure 15A:
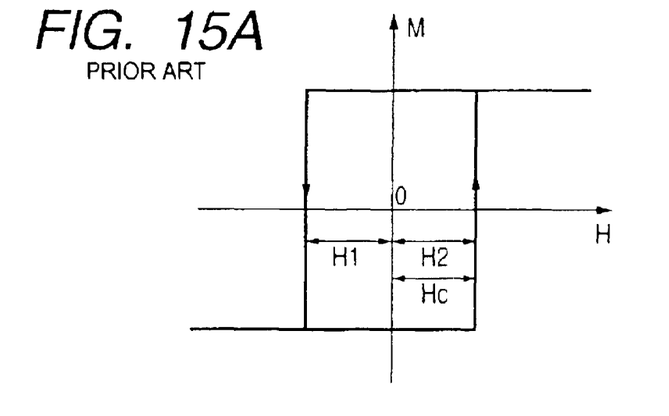
FIGS. 15A, 15B and 15C are graphs showing an offset magnetic field on an MR curve for a squareness ratio of 1.

FIG. 15A shows the MH curve of this element (graph showing the relationship between the magnetization and an application magnetic field) on the assumption that no stray magnetic field is leaked from the magnetic film with a squareness ratio of 1. Since the magnetization direction of the magnetic film (pinned layer) 200 cannot be changed, the resistance changes in correspondence with the magnetization direction of the magnetic film (memory layer) 100. In the absence of an offset magnetic field, information can be recorded in the memory layer only by applying a magnetic field H1 or H2 equal to a coercive force Hc. The magnetic field H1 switches the magnetic film 100 from the upward direction to the downward direction. The magnetic field H2 switches the magnetic film 100 from the downward direction to the upward direction.

Figure 15B:
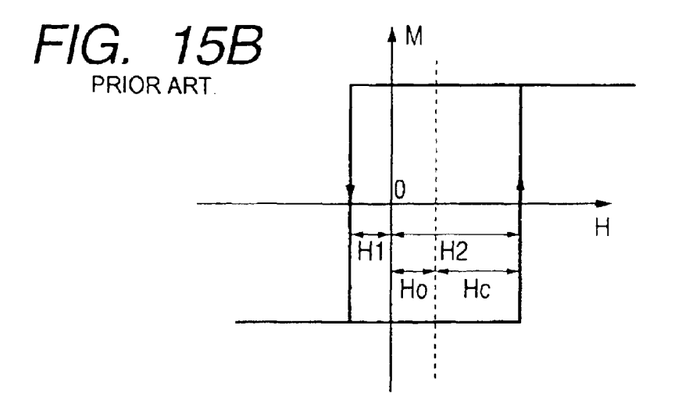
Figure 15C:
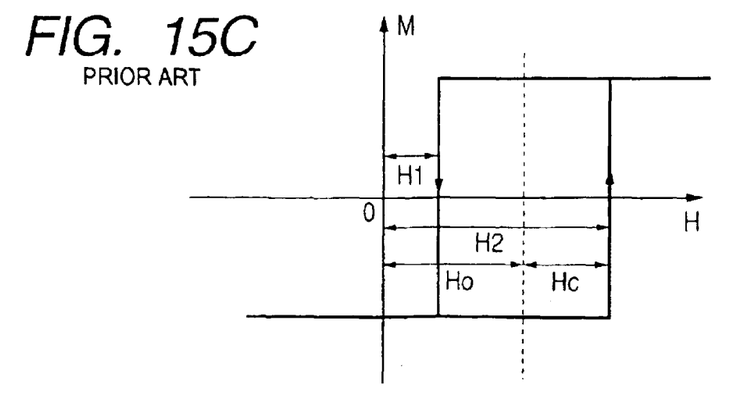

In practice, the magnetic film (pinned layer) 200 applies a downward magnetic field to the magnetic film (memory layer) 100. The MR curve shifts by an offset magnetic field, as shown in FIG. 15B. In this case, the recording magnetic field is H2=Hc+Ho and H1=Hc−Ho. The magnetic field necessary to change the state of FIG. 14B to that of FIG. 14A decreases by Ho. To the contrary, the magnetic field necessary to change the state of FIG. 14A to that of FIG. 14B increases by Ho. FIG. 15B shows the magnetization curve at this time. This graph shows that the current value flowing through a write line changes depending on a rewrite magnetization direction. The current consumption increases, or when the current exceeds the allowable current density of write line wiring, write fails. In this case, the intensity of a switching magnetic field changes depending on information recorded on a memory cell. If memory cell information which requires the switching magnetic field H2 is rewritten in recording information in memory cells arrayed in a matrix via two perpendicular write lines, adjacent memory cell information which requires the switching magnetic field H1 is also rewritten. Such erroneous recording operation may occur at a high possibility. If the offset magnetic field Ho becomes larger than the coercive force Hc, as shown in FIG. 15C, only one resistance value can be taken in zero magnetic field. This makes absolute detection difficult.

Figure 16A:
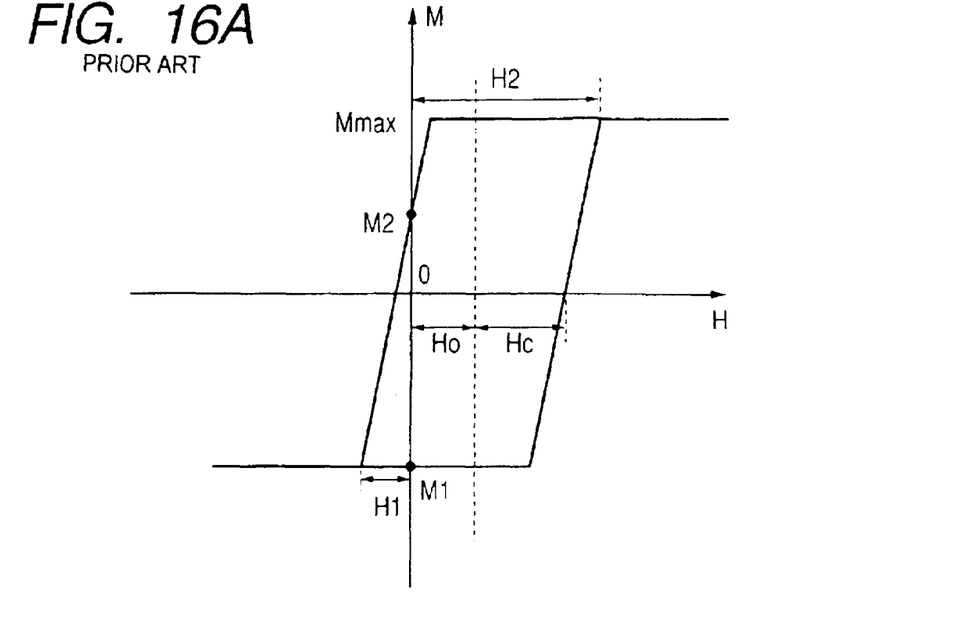
FIGS. 16A and 16B are graphs showing an offset magnetic field on an MR curve for a squareness ratio of not 1.
Figure 16B:
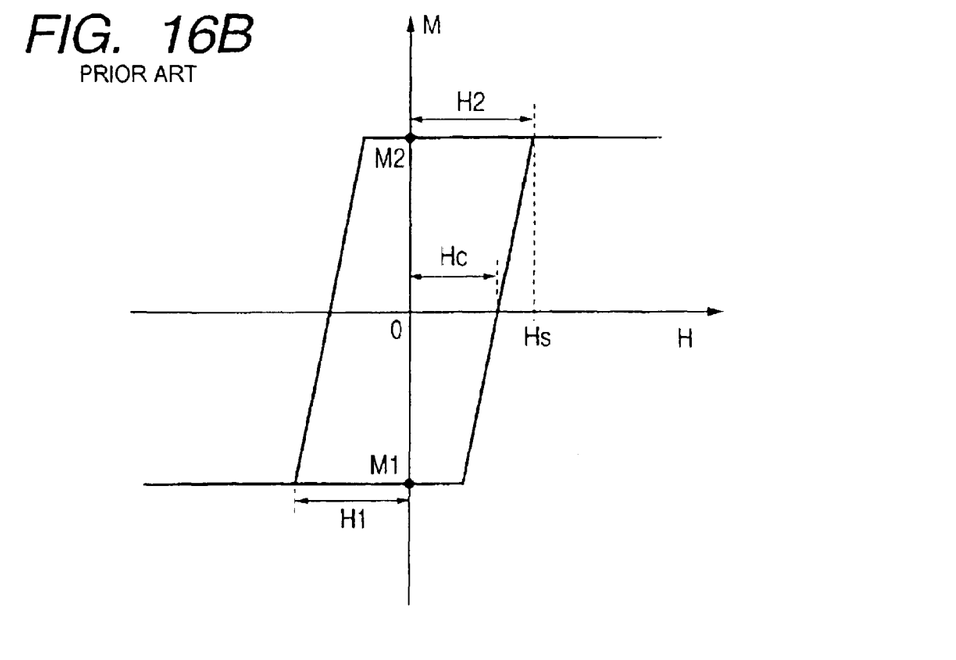

When the squareness ratio is not 1, as shown in FIGS. 16A and 16B, a resistance value M2 in zero magnetic field becomes smaller than a maximum magnetization value Mmax of an antiparallel magnetization state. The resistance value also changes depending on the magnetization intensity of the low-coercive-force layer. In this case, a readout resistance value difference M2−M1 decreases, degrading the detection sensitivity. A memory element with a squareness ratio of not 1 is more greatly influenced by the offset magnetic field. This phenomenon occurs even in an offset magnetic field Ho smaller than the coercive force Hc. Note that M1 represents the minimum resistance value in the absence of an external magnetic field; and M2, the maximum resistance value in the absence of an external magnetic field. FIG. 16A shows the resistance value in the presence of the offset magnetic field Ho, and FIG. 16B shows the resistance value in the absence of the offset magnetic field Ho.

For a squareness ratio of not 1, even application of a magnetic field equal in intensity to the coercive force does not completely saturate the magnetization, as shown in FIG. 16B. A magnetic field which completely saturates the magnetization, M=Ms, will be called a magnetization saturation magnetic field Hs. When the memory layer completely saturates to be antiparallel to the pinned layer, the resistance value maximizes to a constant value with respect to the magnetic field. That is, the magnetic field which saturates in the resistance value is equal to Hs, as shown in FIG. 16B. For a squareness ratio of 1, the coercive force can be regarded equal to a magnetization switching magnetic field. For a squareness ratio of not 1, the coercive force cannot be regarded equal to this magnetic field. In this case, the magnetization must be switched by applying a magnetic field larger than that having a squareness ratio of 1. In the presence of an offset magnetic field generated by a stray magnetic field, the difference in the intensity of a magnetic field applied to switch the magnetization becomes larger between a direction in which the magnetization is easy to switch and a direction in which the magnetization is difficult to switch. If such an element is employed as the memory element of an MRAM, the above-described erroneous operation may occur at a higher possibility. Malfunction may occur when a magnetization switching magnetic field is not controlled in the use of a magnetoresistive element as the memory element of an MRAM.

It is an object of the present invention to solve the problem that a static magnetic field from one magnetic layer offsets the switching magnetic field of the other magnetic layer in a magnetoresistive element used as a memory element or the like, and to provide a memory element using this magnetoresistive element and its recording/reproduction method.

SUMMARY OF THE INVENTION

According to the present invention, the above object is achieved by a magnetoresistive element comprising a structure of sandwiching a nonmagnetic layer between a first magnetic layer magnetized perpendicular to a film surface and a second magnetic layer magnetized perpendicular to the film surface with a coercive force larger than that of the first magnetic layer, wherein a magnetic field applied from the second magnetic layer to the first magnetic layer is smaller than a magnetization saturation magnetic field of the first magnetic layer.

The above object is also achieved by a memory element comprising the magnetoresistive element, and magnetic field generation means for generating a magnetic field perpendicular to a film surface in the magnetoresistive element, wherein information is recorded on the magnetoresistive element by using the magnetic field generation means. The above object is further achieved by an MRAM comprising a plurality of memory elements which are arrayed in a matrix on a substrate, a plurality of bit lines each connected to one terminal of a corresponding one of the memory elements, a plurality of write lines which cross the bit lines and serve as the magnetic field generation means for applying a magnetic field to the memory elements, memory element selection switching elements each connected to the other terminal of a corresponding one of the memory elements, and a plurality of sense amplifiers each of which has one terminal connected to a corresponding one of the bit lines and detects a resistance value of the memory element, wherein information is recorded by magnetic fields applied from the write and bit lines, and information is reproduced by applying a voltage to the bit line and inputting the resistance of the memory element to the sense amplifier.

The above and other objects, features, and advantages of the present invention will be apparent from the following detailed description of the preferred embodiments in conjunction with the accompanying drawings.

DETAILED DESCRIPTION OF THE PREFERRED EMBODIMENTS

Preferred embodiments of the present invention will be described below with reference to the accompanying drawings.

(First Embodiment)

Figure 1A:
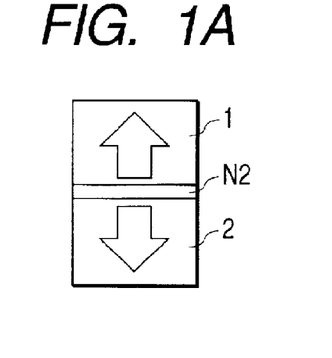
FIGS. 1A and 1B are sectional views showing a magnetoresistive element according to the first embodiment of the present invention.
Figure 1B:
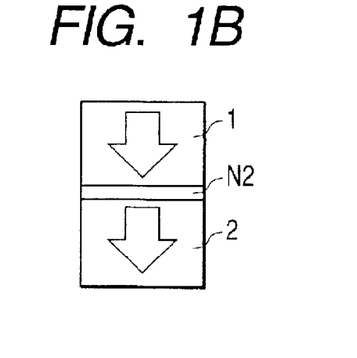

FIGS. 1A and 1B are sectional views showing the film structure of a magnetoresistive element according to the first embodiment of the present invention. In FIGS. 1A and 1B, arrows indicate magnetization directions in magnetic layers. FIGS. 1A and 1B show two prospective magnetization states of the magnetoresistive element.

As shown in FIGS. 1A and 1B, a first magnetic layer 1 magnetized perpendicularly to the film surface, a nonmagnetic layer, e.g., insulating layer N2, and a second magnetic layer 2 magnetized perpendicularly to the film surface are stacked in an order named. The insulating layer N2 is thick enough to flow a tunnel current between the magnetic layers 1 and 2 via the insulating layer N2. The coercive force (magnetization saturation magnetic field) of the second magnetic layer 2 is higher than that of the first magnetic layer 1. A resistance value upon flowing a current between the first and second magnetic layers 1 and 2 via the insulating layer N2 changes depending on the relative magnetization angles of the first and second magnetic layers 1 and 2. More specifically, the first magnetic layer 1, insulating layer N2, and second magnetic layer 2 form a ferromagnetic tunnel junction. Conduction electrons in the magnetic layers 1 and 2 tunnel through the insulating layer N2 while maintaining their spin. The tunnel probability changes depending on the magnetization states of the two magnetic layers 1 and 2. This is detected as a change in tunnel resistance. The resistance value is small when the magnetization states of the magnetic layers 1 and 2 are parallel to each other, and large when they are antiparallel to each other. This magnetoresistive element may be constituted as a GMR element by replacing the nonmagnetic layer with a conductor.

In recording/reproduction, the second magnetic layer 2 is always magnetized in the same direction, e.g., downward. The first magnetic layer 1 is magnetized upward or downward in accordance with recording information.

Recording of information is decided by the magnetization direction of the first magnetic layer. The first magnetic layer is magnetized downward in FIG. 1A and upward in FIG. 1B. These directions can be made to correspond to binary storage levels "0" and "1". These states can be controlled by the direction of a current which flows through a write line laid near the element via an insulating film to generate a magnetic field perpendicular to the film surface. The current direction changes the direction of an application magnetic field. To read out recorded information, a current is flowed in a direction in which the magneto-resistance effect is developed. For example, for a TMR element, a current is generally flowed perpendicularly to the film surface. The element resistance value changes depending on the magnetization directions of the first and second magnetic layers, and particularly depending on whether the magnetization directions of iron family elements are parallel or antiparallel between these magnetic layers. The element resistance value is measured, and the difference from a reference resistance is calculated, thereby reading out recorded information.

Figure 2A:
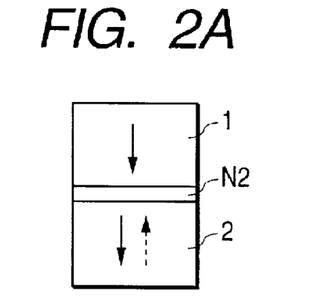
FIGS. 2A and 2B are sectional views showing a magnetoresistive element using a rare-earth iron family alloy as the second magnetic layer.
Figure 2B:
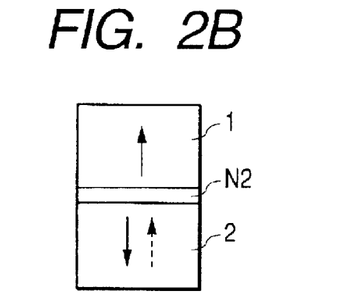
Figure 3:
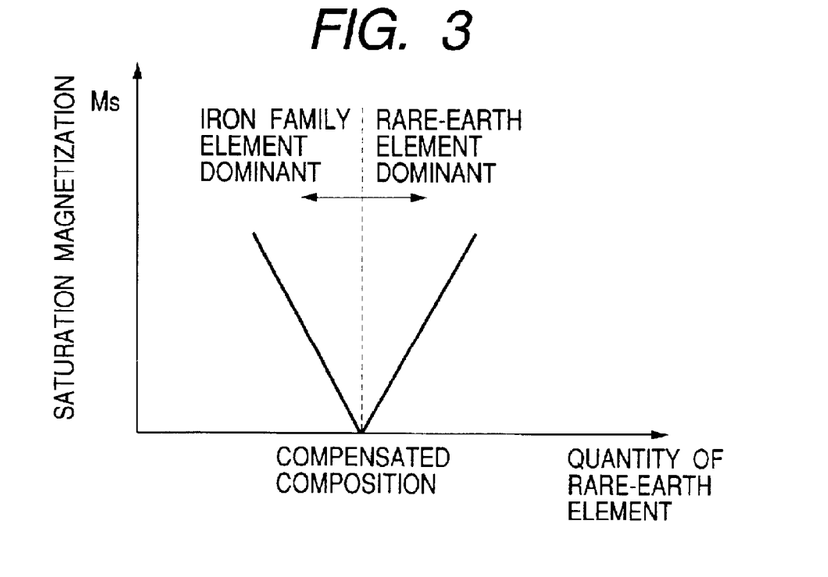
FIG. 3 is a graph showing the relationship between the composition of the rare-earth iron family alloy and the saturation magnetization intensity.

The second magnetic layer is a perpendicular magnetization film, and is made of, e.g., a ferrimagnet. A case wherein a ferrimagnetic layer made of a rare-earth iron family alloy is used as the second magnetic layer 2 will be explained with reference to FIGS. 2A and 2B. In FIGS. 2A and 2B, each solid array indicates the sublattice magnetization direction of an iron family element, and each dotted arrow indicates the sublattice magnetization direction of a rare-earth element. The composition of the second magnetic layer 2 is set around a compensated composition. That is, the sublattice magnetization intensity of the rare-earth element is almost equal to that of the iron family element. FIG. 3 is a graph showing the relationship between the content of the rare-earth element in the rare-earth iron family alloy and a saturation magnetization Ms. As shown in FIG. 3, the magnetization of the rare-earth iron family content changes depending on the quantity of the rare-earth element. The magnetization of the entire second magnetic layer 2 is determined by the difference in sublattice magnetization. Therefore, the magnetization intensity of the second magnetic layer 2 can be satisfactorily reduced. The intensity of a magnetic field generated from the magnetic layer is proportional to the magnetization intensity. The use of the rare-earth iron family alloy film whose composition is close to the compensated composition can sufficiently decrease a stray magnetic field leaked from the second magnetic layer 2 to the first magnetic layer 1. A change in resistance in the magneto-resistance effect mainly depends on the sublattice magnetization intensity of the iron family element. The total magnetization intensity can be reduced without reducing the sublattice magnetization of the iron family element. Accordingly, the offset magnetic field can be satisfactorily reduced without degrading the magneto-resistance effect.

Examples of the material of a magnetic layer used as the second magnetic layer 2 are TbFe, TbFeCo, DyFe and DyFeCo having relatively high coercive forces. Examples of the material of a magnetic layer used as the first magnetic layer 1 are GdFe and GdFeCo whose coercive forces can be decreased.

The second magnetic layer 2 in the first embodiment employs a film whose saturation magnetization Ms can be reduced by setting the composition of the rare-earth iron family alloy around the compensated composition, as described above. This increases a switching magnetic field. The magnetoresistive element can use the second magnetic layer as a pinned layer, is suitable for absolute detection, and can decrease the stray magnetic field. The coercive force of the perpendicular magnetization film can be easily adjusted to several kOe or more. A high-coercive-force layer can be formed by properly selecting the material of the magnetic layer without pinning using an antiferromagnetic film, unlike a longitudinal magnetization film. The magnetoresistive element of the first embodiment can obtain a desired characteristic with a simple structure without complicating the structure.

The first embodiment can reduce the saturation magnetization of the second magnetic layer, can decrease a stray magnetic field leaked to the first magnetic layer, and can decrease an offset magnetic field. The second magnetic layer is formed from a rare-earth iron family alloy film, and its composition is set around the compensated composition. This can decrease a stray magnetic field and can increase the coercive force. The second magnetic layer is preferably used as a pinned layer which requires high coercive force.

(Second Embodiment)

Table 1 shows in the oersted (Oe) unit and the meter per ampere (A/m) unit a stray magnetic field H perpendicular to the film surface at a position apart from the upper surface by a distance z (nm) at the center of a perpendicular magnetization film having a film thickness h (nm), length L ($\mu$m), width L ($\mu$m), and magnetization (residual magnetization) M in the absence of an external magnetic field. The stray magnetic field increases for a smaller length (=width) L, larger film thickness, or larger M. In Table 1 "z=1.5 nm" is the representative value of the film thickness of a spin tunnel film used in an MRAM. This film thickness falls within a standard film thickness range. Numerical values in Table 1 are considered to be valid for z=0.5 nm to 3 nm.

TABLE 1

| h (nm) | L (μm) | z (nm) | Ms = 10 emu/cc | | Ms = 20 emu/cc | | Ms = 40 emu/cc | |
|---|---|---|---|---|---|---|---|---|
| | | | H (Oe) | H (A/m) | H (Oe) | H (A/m) | H (Oe) | H(A/m) |
| 20 | 0.1 | 1.5 | 22 | 1751 | 44 | 3502 | 87 | 6923 |
| 20 | 0.2 | 1.5 | 12 | 955 | 24 | 1910 | 48 | 3820 |
| 20 | 0.3 | 1.5 | 8 | 637 | 16 | 1273 | 33 | 2626 |
| 20 | 0.4 | 1.5 | 6 | 477 | 12 | 955 | 25 | 1990 |
| 20 | 0.5 | 1.5 | 5 | 398 | 10 | 798 | 20 | 1592 |
| 30 | 0.1 | 1.5 | 29 | 2308 | 57 | 4536 | 114 | 9072 |
| 30 | 0.2 | 1.5 | 17 | 1353 | 35 | 2785 | 70 | 5571 |
| 30 | 0.3 | 1.5 | 12 | 955 | 24 | 1910 | 49 | 3899 |
| 30 | 0.4 | 1.5 | 9 | 716 | 18 | 1432 | 37 | 2944 |
| 30 | 0.5 | 1.5 | 7 | 557 | 15 | 1194 | 30 | 2387 |
| 40 | 0.1 | 1.5 | 33 | 2626 | 65 | 5173 | 131 | 10425 |
| 40 | 0.2 | 1.5 | 22 | 1751 | 44 | 3502 | 89 | 7083 |
| 40 | 0.3 | 1.5 | 16 | 1273 | 32 | 2547 | 63 | 5014 |
| 40 | 0.4 | 1.5 | 12 | 955 | 24 | 1910 | 49 | 3699 |
| 40 | 0.5 | 1.5 | 10 | 796 | 20 | 1592 | 39 | 3104 |

Figure 4:
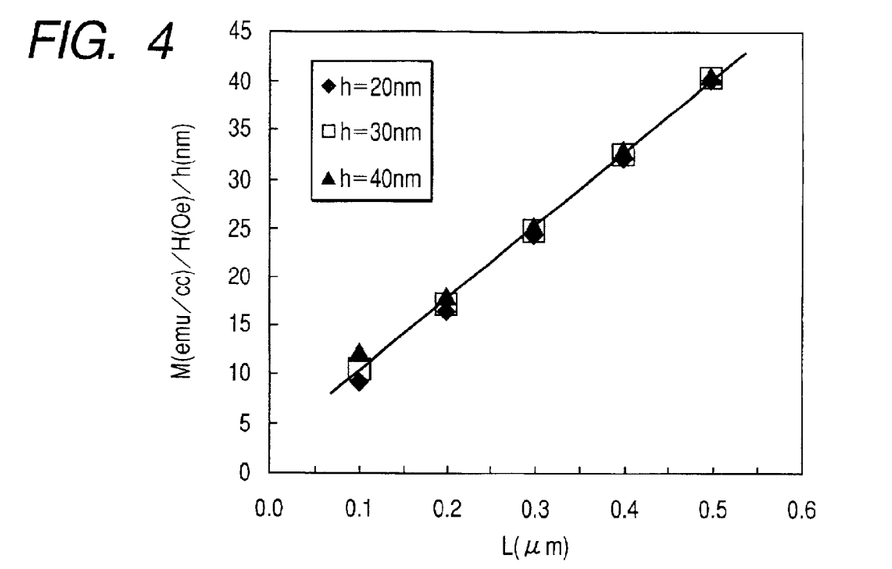
FIG. 4 is a graph showing the relationship between a stray magnetic field H leaked from a perpendicular magnetization film and the element size.

The stray magnetic field H is expressed in the Oe unit, and M/H×h is plotted for L, as shown in FIG. 4. Their relation is given by $$M/H \times h = 75 \times L + 2.6 \quad (1)$$

The stray magnetic field H (Oe) can be given by $$H = M \times h / (75 \times L + 2.6) \quad (2)$$

Letting π be the circular constant, the stray magnetic field is given in the A/m unit by $$H = 250 \times M \times h / (\pi \times (75 \times L + 2.6)) \quad (2)'$$

Considering a magnetoresistive element as the memory element of an MRAM, the offset magnetic field must be smaller than the magnetization saturation magnetic field of a first magnetic layer 1. This is particularly necessary when information is read out by the absolute detection method. The intensity of the magnetization saturation magnetic field is equal to or larger than the coercive force. Letting M be the residual magnetization (emu/cc) of a second magnetic layer 2 in equation (2), h be the film thickness (nm), and L be the element length (μm), the magnetization saturation magnetic field Hs (Oe) of the first magnetic layer preferably meets $$M \times h / (75 \times L + 2.6) < Hs \quad (3)$$

The magnetization saturation magnetic field is given in the A/m unit by $$250 \times M \times h / (\pi \times (75 \times L + 2.6)) < Hs \quad (3)'$$

(Third Embodiment)

When the magnetoresistive element of the third embodiment is used as the memory element of an MRAM, the first magnetic layer functions as a detection layer, and a second magnetic layer functions as a memory layer. Information is written by changing the magnetization direction of a high-coercive-force layer. In read, the magnetization of only the first magnetic layer is switched, a change in resistance is detected, and a difference is detected, thereby reproducing information.

If the magnetization of particularly the high-coercive-force layer is decreased using a ferrimagnet (to be described later), the magnetization switching magnetic field increases. The large magnetization switching magnetic field increases energy necessary to switch the magnetization, e.g., a current value flowing through a write line. It is preferable for this element to form the second magnetic layer from a magnetic layer whose magnetization direction is pinned and to record magnetization information in the first magnetic layer.

(Fourth Embodiment)

In addition to the structure of the magnetoresistive element in the first embodiment, the coercive force (magnetization saturation magnetic field) of the first magnetic layer, i.e., low-coercive-force layer was examined. A large coercive force of a first magnetic layer 1 increases a current necessary for write in the magnetoresistive element used for an MRAM. A practical coercive force is desirably at least 200 Oe ($1.59 \times 10^4$ A/m) or less for consumer use. In terms of the power consumption, the coercive force is 100 Oe ($7.96 \times 10^3$ A/m) or less, preferably 50 Oe ($3.98 \times 10^3$ A/m) or less, more preferably 20 Oe ($1.59 \times 10^3$ A/m) or less, and most preferably 10 Oe (796 A/m) or less. When the magnetoresistive element is used as the memory element of an MRAM under the influence of an external magnetic field, the magnetization fluctuates owing to a magnetic field generated in write to an adjacent memory element. To prevent this, the coercive force is preferably 5 Oe or more.

Letting M be the residual magnetization (emu/cc) of a second magnetic layer 2 serving as a high-coercive-force layer, h be the film thickness (nm), and L be the element length (μm), the second magnetic layer 2, i.e., high-coercive-force layer further preferably satisfies $$M \times h / (75 \times L + 2.6) < 200 \quad (4)$$

(Fifth Embodiment)

In addition to the structure of the magnetoresistive element in the first embodiment, the residual magnetization M (emu/cc) of a second magnetic layer 2 serving as a high-coercive-force layer is preferably close to a value given by equation (5) as a modification of equation (2):

$$M = Hs / h \times (75 \times L + 2.6) \quad (5)$$

where h is the film thickness (nm) of the second magnetic layer, L is the element length (μm), and Hs (Oe) is the magnetization saturation magnetic field of a first magnetic layer 1.

To express the magnetization saturation magnetic field Hs of the first magnetic layer 1 in the A/m unit, equation (5) is rewritten into $$M = \pi \times Hs / (250 \times h \times (75 \times L + 2.6)) \quad (5)'$$

The film thickness h of the second magnetic layer is preferably set to about 2 nm to 100 nm. This is because the magnetization is difficult to stably maintain for a film thickness smaller than 2 nm. For a film thickness larger than 10 nm, an allowable magnetization value decreases, failing to ensure a composition margin. Process problems such as difficult etching readily occur. From this, the film thickness is preferably 80 nm or less, and more preferably 50 nm or less.

The film thickness of the second magnetic layer was changed from 2 nm to 50 nm. Table 2 shows the film thickness of the high-coercive-force layer and the value of the residual magnetization M (emu/cc) of the second magnetic layer 2 when the element length L is selected from 0.1 $\mu$m, 0.2 $\mu$m, 0.3 $\mu$m, 0.4 $\mu$m and 0.5 $\mu$m, the film thickness h of the second magnetic layer 2 is selected from 2 nm, 5 nm, 10 nm, 20 nm, 30 nm, 40 nm and 50 nm, and the coercive force Hc of the first magnetic layer is selected from 5 Oe (398 A/m), 10 Oe (796 A/m), 20 Oe ($1.59 \times 10^3$ A/m), and 50 Oe ($3.98 \times 10^3$ A/m).

TABLE 2

| L $\mu$m | h nm | H Oe | M emu/cc | H Oe | M emu/cc | H Oe | M emu/cc | H Oe | M emu/cc |
|---|---|---|---|---|---|---|---|---|---|
| 0.1 | 2 | 5 | 25 | 10 | 51 | 20 | 101 | 50 | 253 |
| 0.2 | 2 | 5 | 44 | 10 | 88 | 20 | 176 | 50 | 440 |
| 0.3 | 2 | 5 | 63 | 10 | 126 | 20 | 251 | 50 | 628 |
| 0.4 | 2 | 5 | 82 | 10 | 163 | 20 | 326 | 50 | 815 |
| 0.5 | 2 | 5 | 100 | 10 | 201 | 20 | 401 | 50 | 1003 |
| 0.1 | 5 | 5 | 10 | 10 | 20 | 20 | 40 | 50 | 101 |
| 0.2 | 5 | 5 | 18 | 10 | 35 | 20 | 70 | 50 | 176 |
| 0.3 | 5 | 5 | 25 | 10 | 50 | 20 | 100 | 50 | 251 |
| 0.4 | 5 | 5 | 33 | 10 | 65 | 20 | 130 | 50 | 326 |
| 0.5 | 5 | 5 | 40 | 10 | 80 | 20 | 160 | 50 | 401 |
| 0.1 | 10 | 5 | 5 | 10 | 10 | 20 | 20 | 50 | 51 |
| 0.2 | 10 | 5 | 9 | 10 | 18 | 20 | 35 | 50 | 88 |
| 0.3 | 10 | 5 | 13 | 10 | 25 | 20 | 50 | 50 | 126 |
| 0.4 | 10 | 5 | 16 | 10 | 33 | 20 | 65 | 50 | 163 |
| 0.5 | 10 | 5 | 20 | 10 | 40 | 20 | 80 | 50 | 201 |
| 0.1 | 20 | 5 | 3 | 10 | 5 | 20 | 10 | 50 | 25 |
| 0.2 | 20 | 5 | 4 | 10 | 9 | 20 | 18 | 50 | 44 |
| 0.3 | 20 | 5 | 6 | 10 | 13 | 20 | 25 | 50 | 63 |
| 0.4 | 20 | 5 | 8 | 10 | 16 | 20 | 33 | 50 | 82 |
| 0.5 | 20 | 5 | 10 | 10 | 20 | 20 | 40 | 50 | 100 |
| 0.1 | 30 | 5 | 2 | 10 | 3 | 20 | 7 | 50 | 17 |
| 0.2 | 30 | 5 | 3 | 10 | 6 | 20 | 12 | 50 | 29 |
| 0.3 | 30 | 5 | 4 | 10 | 8 | 20 | 17 | 50 | 42 |
| 0.4 | 30 | 5 | 5 | 10 | 11 | 20 | 22 | 50 | 54 |
| 0.5 | 30 | 5 | 7 | 10 | 13 | 20 | 27 | 50 | 67 |
| 0.1 | 40 | 5 | 1 | 10 | 3 | 20 | 5 | 50 | 13 |
| 0.2 | 40 | 5 | 2 | 10 | 4 | 20 | 9 | 50 | 22 |
| 0.3 | 40 | 5 | 3 | 10 | 6 | 20 | 13 | 50 | 31 |
| 0.4 | 40 | 5 | 4 | 10 | 8 | 20 | 16 | 50 | 41 |
| 0.5 | 40 | 5 | 5 | 10 | 10 | 20 | 20 | 50 | 50 |
| 0.1 | 50 | 5 | 1 | 10 | 2 | 20 | 4 | 50 | 10 |
| 0.2 | 50 | 5 | 2 | 10 | 4 | 20 | 7 | 50 | 18 |
| 0.3 | 50 | 5 | 3 | 10 | 5 | 20 | 10 | 50 | 25 |
| 0.4 | 50 | 5 | 3 | 10 | 7 | 20 | 13 | 50 | 33 |
| 0.5 | 50 | 5 | 4 | 10 | 8 | 20 | 16 | 50 | 40 |

As described above, the offset magnetic field is 50 Oe ($3.98 \times 10^3$ A/m) or less, preferably 20 Oe ($1.59 \times 10^3$ A/m) or less, more preferably 10 Oe (796 A/m) or less, and most preferably 5 Oe (398 A/m) or less. The element size is desirably 0.3 $\mu$m or less in terms of the integration degree of a practical nonvolatile memory. The film thickness of the second magnetic layer is preferably 2 nm or more, as described above. A decrease in film thickness decreases the volume of the magnetic layer upon miniaturization. The magnetization may become difficult to thermally stably save. Thus, the film thickness of the second magnetic layer is more preferably 5 nm or more.

For h=5 nm, L=0.3 $\mu$m or less and H=20 Oe or less. For h=10 nm, preferably L=0.3 $\mu$m or less and H=20 Oe or less, more preferably L=0.1 $\mu$m or less and H=20 Oe or less, and most preferably H=10 Oe or less.

Considering this, the magnetization intensity of the second magnetic layer 2 is 100 emu/cc or less, preferably 50 emu/cc or less, more preferably 20 emu/cc or less, and most preferably 10 emu/cc or less.

In the above description, the element length L means a longer one of the width and length of the magnetoresistive element.

(Sixth Embodiment)

Figure 5:
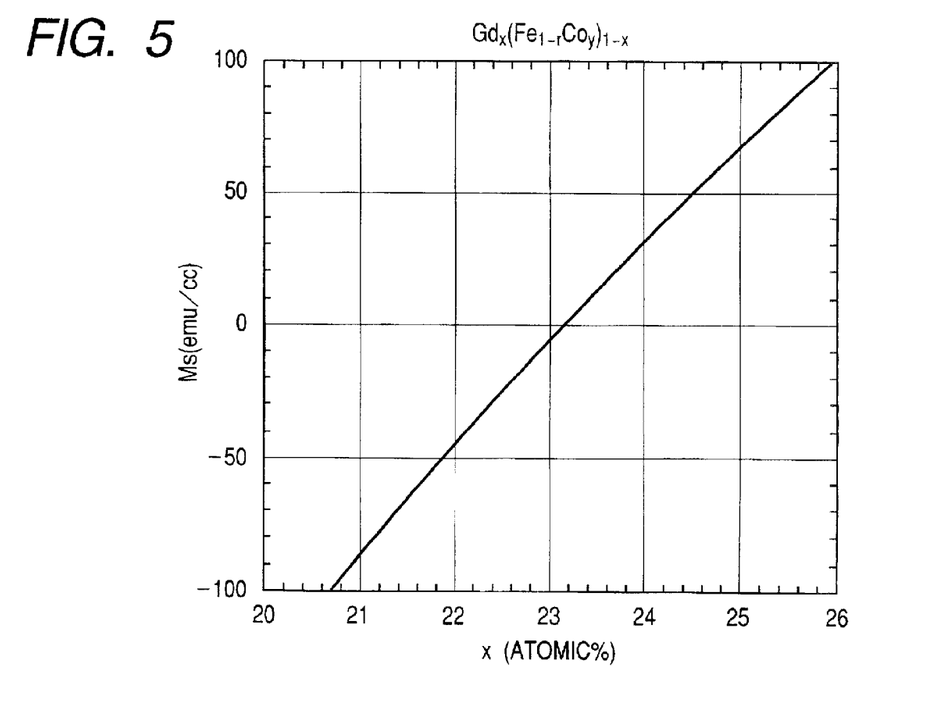
FIG. 5 is a graph showing the relationship between the composition of the rare-earth iron family alloy and the saturation magnetization.

FIG. 5 shows the relationship between the composition and the saturation magnetization for a rare-earth iron family alloy film $Gd_x(Fe_{1-y}Co_y)_{1-x}$ (y=0.1 to 0.5). Also, as for $Tb_x(Fe_{1-y}Co_y)_{1-x}$ and $Dy_x(Fe_{1-y}Co_y)_{1-x}$, the saturation magnetization intensity tends to increase for a higher content of the rare-earth metal when the Gd concentration is at the compensated composition (around 23.2% in FIG. 5) or more, and vice versa at the compensated composition or less. As described in the fourth embodiment, the magnetization intensity of a second magnetic layer 2 is desirably 100 emu/cc or less, preferably 50 emu/cc or less, more preferably 20 emu/cc or less, and most preferably 10 emu/cc or less. Referring to FIG. 5, the composition of a film having such a magnetization intensity falls within desirably ±2.6 atomic % around the compensated composition, preferably ±2.0 atomic %, more preferably ±1.4 atomic %, and most preferably ±0.25 atomic %. In this case, either a rare-earth sublattice dominant composition or an iron family element sublattice dominant composition can be used.

(Seventh Embodiment)

Figure 6A:
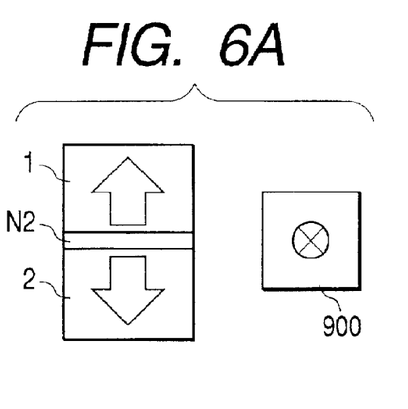
FIGS. 6A and 6B are views showing the basic structure of a memory cell.
Figure 6B:
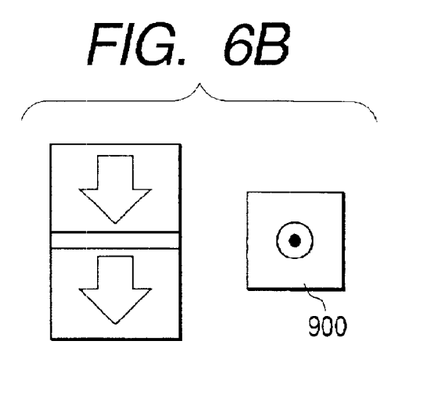

The magnetoresistive element of each of the above-described embodiments adopts a magnetic field generation means for generating a perpendicular magnetic field. Information is recorded in the magnetoresistive element by using the magnetic field generation means. This magnetoresistive element can serve as a memory element. For example, as shown in FIGS. 6A and 6B, a write line 900 is arranged near the magnetoresistive element via an insulating film (not shown). The insulating film is arranged to prevent electrical contact between the magnetoresistive element and the write line. This is important particularly in a TMR element because no spin tunneling effect is developed upon ON operation. The write line 900 extends in a direction perpendicular to the sheet surface. In FIG. 6A, a current is flowed toward the sheet surface to change the magnetization of a first magnetic layer 1 upward. In FIG. 6B, a current is flowed in a front direction from the sheet surface to change the magnetization of the first magnetic layer 1 downward. In this manner, binary information can be recorded in the magnetoresistive element on the basis of the direction of a current flowing through the write line.

When a memory is constituted using this magnetoresistive element, memory elements formed from magnetoresistive elements are arrayed in a matrix. A switching element is preferably disposed to prevent crosstalk between memory elements.

Figure 7:
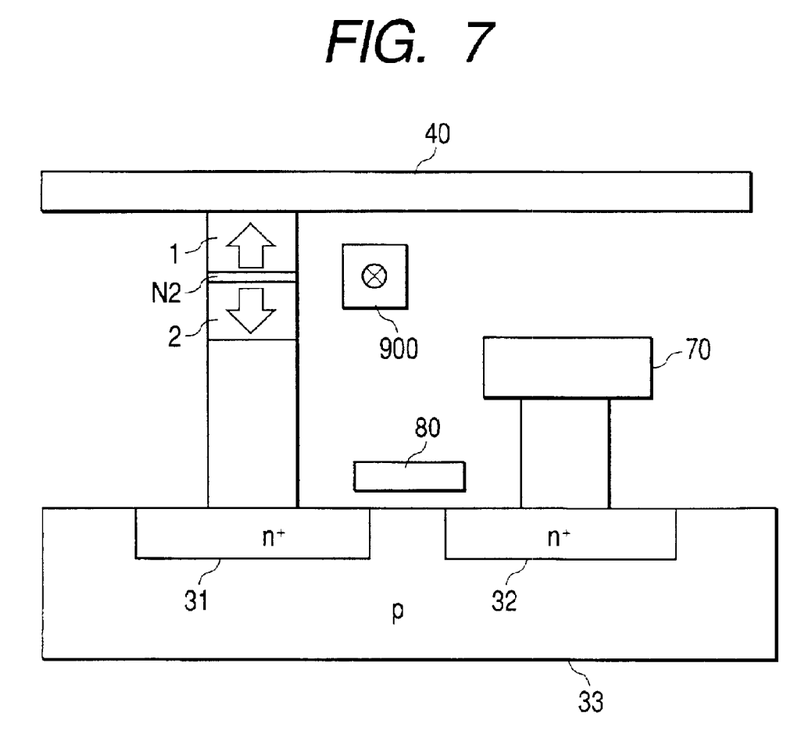
FIG. 7 is a view showing the basic structure of a hybrid memory cell having a semiconductor element.

FIG. 7 is a schematic sectional view showing a 1-bit memory cell having a switching element. In practice, identical memory cells are aligned in the lateral direction and direction of depth in FIG. 7, and are arrayed in a matrix when viewed from above.

In FIG. 7, one terminal of a magnetoresistive element is connected to a drain region 31 in a MOSFET (Metal Oxide Semiconductor Field Effect Transistor) made up of a gate electrode 80, and source and drain regions 32 and 31 which are $n^+$type regions formed in a silicon semiconductor p-type substrate 33. The other terminal of the magnetoresistive element is connected to a sense line 40.

In writing/erasing recording information, currents are flowed through the write line 900 extending perpendicularly to the sheet surface and the bit line 40 extending along the sheet surface. As a result, information can be recorded at a magnetoresistive element (memory cell) positioned at the intersection between these lines. An electrode 70 connected to the source region 32 is grounded. A current source and sense circuit are respectively arranged on the left and right sides of the sense line 40. This allows applying a potential corresponding to the resistance value of the magnetoresistive element to the sense circuit, thus detecting information. In the seventh embodiment, the write line is located just besides the element. However, the write line can also be arranged on the substrate side with respect to the memory element or on a side opposite to the substrate because a magnetic field suffices to be applied almost perpendicularly to the film surface. Although arranging the write line just besides the element yields high current efficiency, the write line is preferably arranged on the substrate side in terms of the manufacturing process. A magnetic field perpendicular to the film surface may be applied by a magnetic field from a bit line connected to an adjacent memory element.

(Eighth Embodiment)

Figure 8:
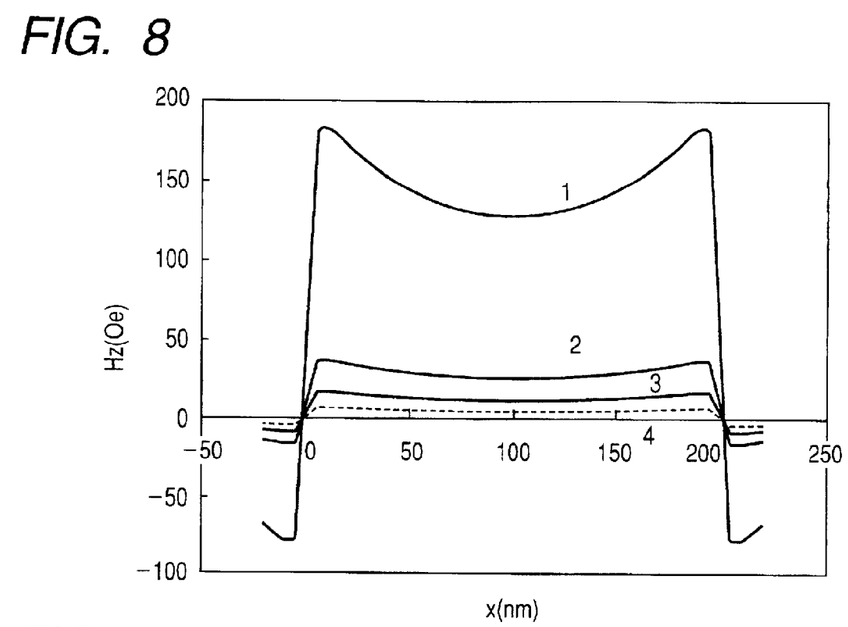
FIG. 8 is a graph showing a stray magnetic field distribution in a magnetoresistive element based on the present invention.
Figure 9:
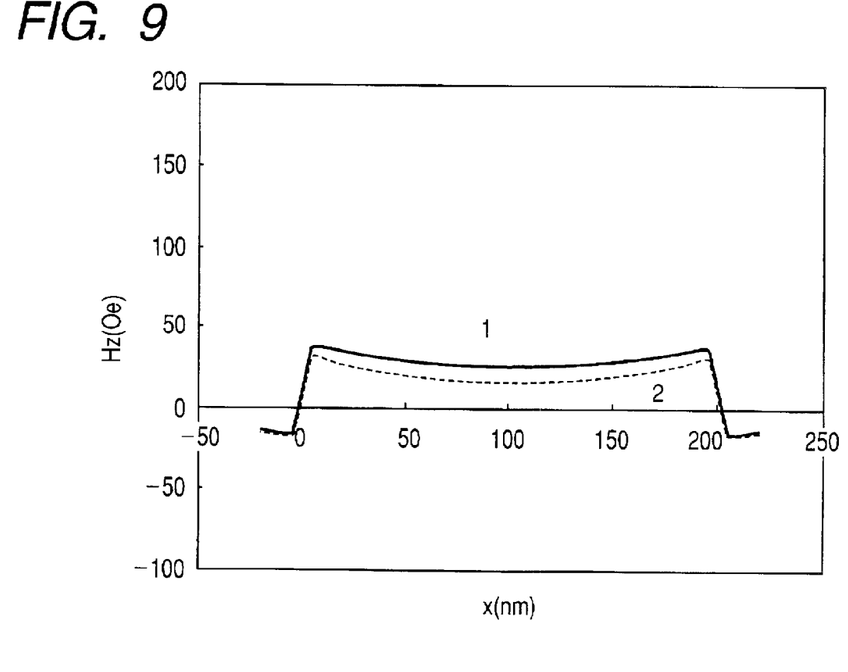
FIG. 9 is a graph showing another stray magnetic field distribution in the magnetoresistive element based on the present invention.
Figure 10:
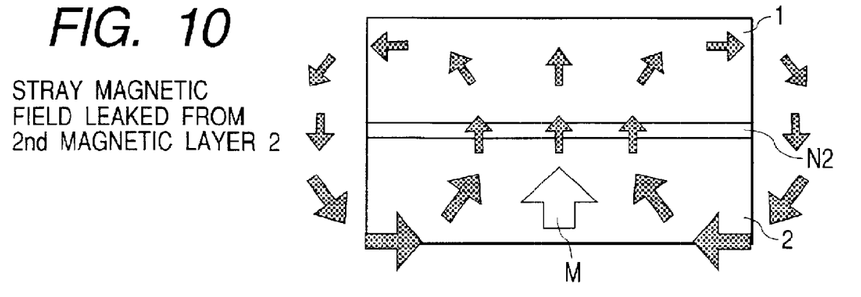
FIG. 10 is a view schematically showing the application state of the stray magnetic field in the magnetoresistive element based on the present invention.

FIGS. 8 and 9 show the simulation results of the distribution of a stray magnetic field which is generated from a range of 0.2 μm□ perpendicular magnetization film and is perpendicular to the film surface. More specifically, as shown in FIG. 10, a stray magnetic field leaked from the magnetization M of a second magnetic layer 2 is applied to a first magnetic layer 1. As the stray magnetic field, a value 1 nm above the second magnetic layer 2 is used.

In FIG. 8, bold solid line 1 represents a simulation result for a magnetization of 50 emu/cc; bold solid line 2, a simulation result for a magnetization of 10 emu/cc; thin solid line 3, a simulation result for a magnetization of 5 emu/cc; and dotted line 4, a simulation result for a magnetization of 2 emu/cc. In any case, the film thickness is 50 nm.

In FIG. 9, solid line 1 represents a simulation result for a film thickness of 50 nm; and dotted line 2, a simulation result for a film thickness of 30 nm. In either case, the magnetization is 10 emu/cc. These magnetization intensities and film thicknesses are easily achieved by a perpendicular magnetization film made of a rare-earth iron family alloy such as TbFe, GdFe, DyFe, DyFeCo, TbFeCo, or GdFeCo.

Figure 11:
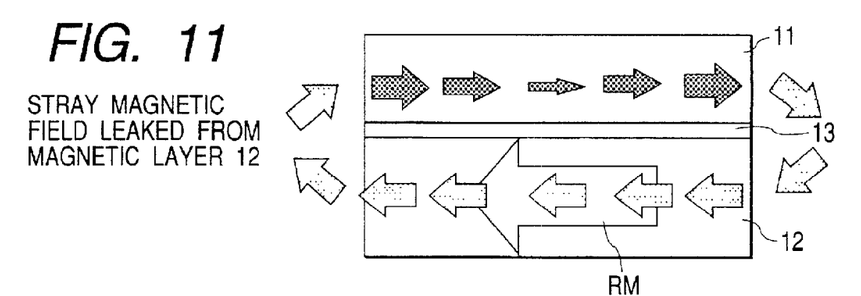
FIG. 11 is a view schematically showing the application state of the stray magnetic field in a magnetoresistive element using a conventional longitudinal magnetization film.
Figure 12:
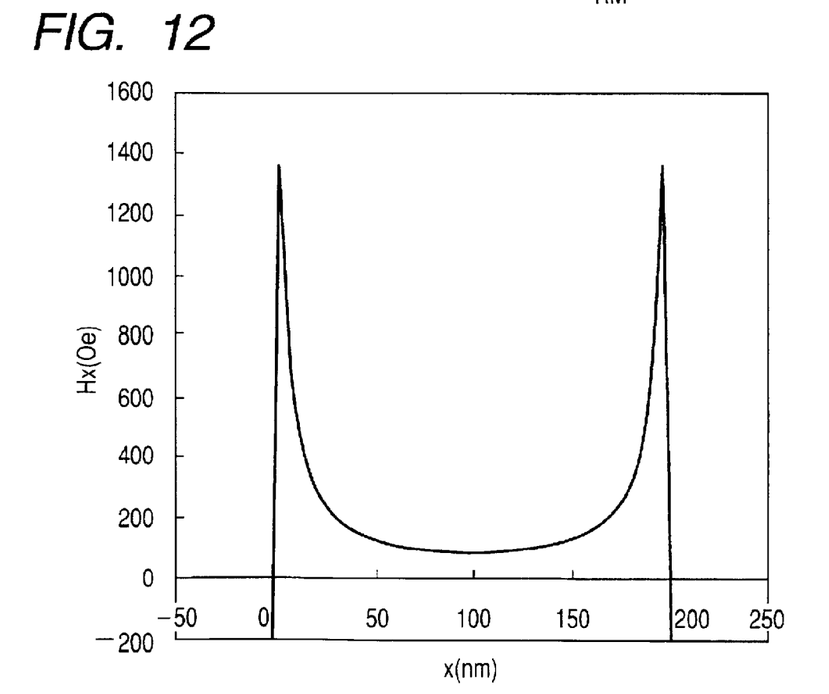
FIG. 12 is a graph showing a stray magnetic field distribution in the magnetoresistive element using the conventional longitudinal magnetization film.
Figure 13:
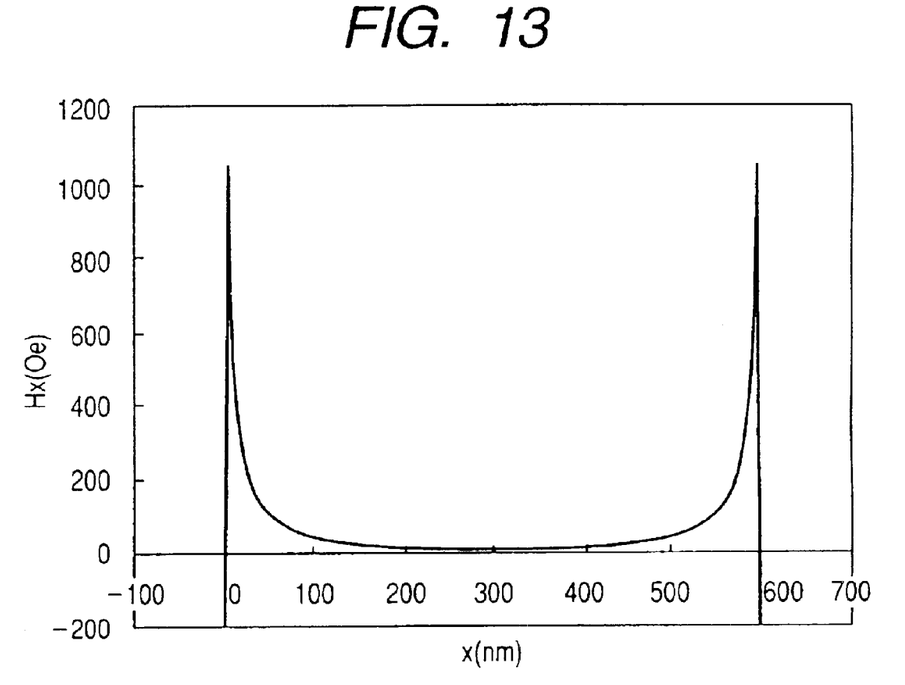
FIG. 13 is a graph showing another stray magnetic field distribution in the magnetoresistive element using the conventional longitudinal magnetization film.

FIG. 11 shows a state in which a stray magnetic field is applied from the magnetization RM of a pinned layer 12 to a memory layer 11 in an longitudinal magnetization film having a conventional structure. An insulating layer 13 is formed between the pinned layer 12 and the memory layer 11. FIG. 12 shows the simulation result of the distribution of a stray magnetic field 1 nm above the film surface which is generated from a range of 0.2 μm□ longitudinal magnetization film and is parallel to the film surface. The simulation result shows that a very large magnetic field of 1,400 Oe ($111 \times 10^3$ A/m) is applied at the end face in comparison with a perpendicular magnetization film. FIG. 13 shows the simulation result of the distribution of a stray magnetic field 1 nm above the film surface which is generated from a 0.2μm×0.6 μm longitudinal magnetization film and is parallel to the film surface. Also in this case, a magnetic field of about 1,000 Oe ($79.6 \times 10^3$ A/m) is applied. The longitudinal magnetization films shown in FIGS. 12 and 13 have a film thickness of 3 nm and a magnetization of 1,000 emu/cc. In the longitudinal magnetization film, magnetization switching is determined by spin motion in the magnetization direction. A stray magnetic field at the end face significantly contributes to magnetization switching. For example, the stray magnetic field assumes to increase an offset magnetic field.

A perpendicular magnetization film and longitudinal magnetization film are compared based on the above results to find that a stray magnetic field of 200 Oe ($15.9 \times 10^3$ A/m) or less is applied to the perpendicular magnetization film and a stray magnetic field of 1,000 Oe ($79.6 \times 10^3$ A/m) or more is applied to the longitudinal magnetization film. In the perpendicular magnetization film, the intensity of the stray magnetic field can be suppressed to 50 Oe ($3.98 \times 10^3$ A/m), and further to 10 Oe (796 A/m) or less by setting the film thickness and the magnetization. This means that an offset magnetic field can be reduced in the magnetoresistive element of the present invention.

In general, an longitudinal magnetization film used for a conventional TMR element is made of NiFe, Co, or Fe, and the saturation magnetization Ms is as large as about 800 to 1,500 emu/cc. In this film, a decrease in magnetization generally decreases the resistance ratio. It is difficult to reduce an offset magnetic field while maintaining the resistance ratio. However, in a ferrimagnet such as a rare-earth iron family alloy, the intensity of the saturation magnetization Ms can be easily decreased to about several ten emu/cc without decreasing the resistance ratio. The intensity of a stray magnetic field from a magnet is proportional to the saturation magnetization Ms. For a ferrimagnet, the magnetization intensity can be decreased, and an offset magnetic field can be suppressed.

(Ninth Embodiment)

Figure 17:
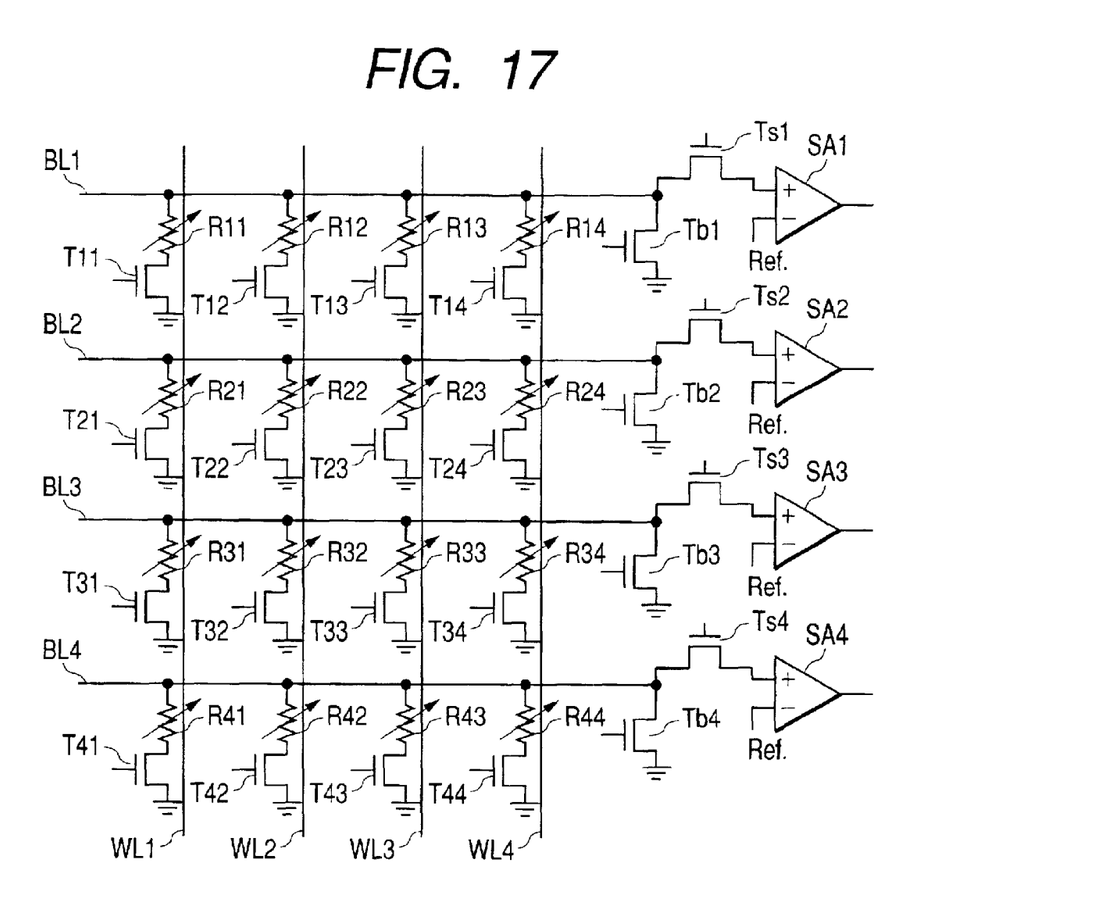
FIG. 17 is an equivalent circuit diagram showing an MRAM in which magnetoresistive elements are arrayed in a 4×4 matrix as memory elements.

FIG. 17 is an equivalent circuit diagram showing an MRAM in which magnetoresistive elements described in the above embodiments are arrayed in a 4×4 matrix as memory elements. The number of memory elements may be larger. Bit lines BL1 to BL4 are arranged parallel to each other, whereas write lines WL1 to WL4 cross the bit lines and are arranged parallel to each other. The write lines are disposed at positions where a magnetic field almost perpendicular to the film surface is applied to the memory elements. FIG. 17 shows 16 memory elements R11 to R44. One terminal of each memory element is connected to a switching element for selecting a memory element, e.g., a corresponding one of transistors T11 to T44. The other terminal of the memory element is connected to a corresponding bit line. One terminal of the bit line is connected to one terminal of a corresponding one of SA1 to SA4 via a corresponding one of switching elements Ts1 to Ts4.

The information write/read method of this MRAM will be explained. In write, a current pulse is applied to any one of WL1 to WL4. A magnetic field induced by this current changes the magnetization of a low-coercive-force layer, thereby recording "1" or "0". If a current pulse is applied to WL3 arranged nearest to R23 in recording information in R23, identical magnetic fields are also applied to R13, R33, and R43. To select only R23 and record information, a current pulse is applied to BL2 at the same time as WL3 to apply a magnetic field in the in-plane direction of R23. This in-plane magnetic field enables easy magnetization switching even with a small magnetic field applied perpendicular to the film surface, in comparison with a case wherein a magnetic field is applied only perpendicularly to the film surface. That is, a magnetic field by a bit line acts as an assist magnetic field. Magnetic fields from WL3 and BL2 permit recording information only in R23.

Read of information will be described. For example, to read out information from R23, the corresponding switching element T23 is turned on to flow a current to BL2. The resistance value of R23 is detected and input to one terminal of the sense amplifier SA2. The other terminal of SA2 receives a reference potential in advance. The resistance value of R23 is detected on the basis of the reference potential, thus reading out information.

This embodiment employs the magnetoresistive element described in the above embodiments as a memory element. The influence of a stray magnetic field leaked from a high-coercive-force layer is weak. When information is read out in the above manner, the resistance value difference between "1" and "0" can be increased, and information can be accurately read out.

What is claimed is:

1. A magnetoresistive element comprising a structure of a nonmagnetic layer between a first magnetic layer magnetized perpendicular to a film plane and a second magnetic layer magnetized perpendicular to the film plane with a coercive force larger than that of the first magnetic layer,
   wherein a magnetic field applied from the second magnetic layer to the first magnetic layer is smaller than a magnetization saturation magnetic field of the first magnetic layer, and
   wherein residual magnetization M (emu/cc), film thickness h (nm), and length L ($\mu$m) of the second magnetic layer, and a magnetization saturation magnetic field Hs (Oe) of the first magnetic layer satisfy $M \times h/(75 \times L + 2.6) < Hs.$ 2. An element according to claim 1, wherein the second magnetic layer is formed from a ferrimagnetic film.

3. An element according to claim 2, wherein the second magnetic layer is formed form a ferrimagnetic film around a compensated composition.

4. An element according to claim 3, wherein the second magnetic layer is formed from a ferrimagnetic film of a rare-earth iron family element alloy, and a content of a rare-earth element in a composition of the ferrimagnetic film falls within ±2.6 atomic %.

5. An element according to claim 2, wherein the ferrimagnetic layer essentially consists of at least one rare-earth element select from the group consisting of Gd, Tb, and Dy and at least one iron family element selected from the group consisting of Fe and Co.

6. An element according to claim 1, wherein the first and second magnetic layers are formed from a ferrimagnetic film.

7. An element according to claim 1, wherein magnetization of the second magnetic layer is always pinned in the same direction.

8. An element according to claim 1, wherein the magnetization saturation magnetic field Hs of the first magnetic layer 1 is not more than 200 Oe.

9. An element according to claim 1, wherein the film thickness of the second magnetic layer falls within a range of 2 nm to 100 nm.

10. An element according to claim 1, wherein saturation magnetization of the second magnetic layer is not more than 100 emu/cc.

11. A memory element comprising:
    a magnetoresistive element comprising a structure of a nonmagnetic layer between a first magnetic layer magnetized perpendicular to a film plane and second magnetic layer magnetized perpendicular to the film plane with a coercive force larger than that of the first magnetic layer; and
    magnetic field generation means for generating a magnetic field perpendicular to a film surface in said magnetoresistive element,
    wherein information is recorded on said magnetoresistive element by using said magnetic field generation means,
    wherein a magnetization saturation magnetic field of the first magnetic layer is at least equal to the coercive force of the first magnetic layer, and a magnetic field applied from the second magnetic layer to the first magnetic layer is smaller than the magnetization saturation magnetic field of the first magnetic layer, and
    wherein residual magnetization M (emu/cc), film thickness h (nm), and length L ($\mu$m) of the second magnetic layer, and a magnetization saturation magnetic field Hs (Oe) of the first magnetic layer satisfy $M \times h/(75 \times L + 2.6) < Hs.$ 12. An MRAM comprising:
    a substrate;
    a plurality of memory elements arrayed in a matrix on said substrate, each memory element comprising a structure of a nonmagnetic layer between a first magnetic layer magnetized perpendicular to a film plane and a second magnetic layer magnetized perpendicular to the film plane with a coercive force larger than that of the first magnetic layer, wherein a magnetization saturation magnetic field of the first magnetic layer is at least equal to the coercive force of the first magnetic layer, and a magnetic field applied from the second magnetic layer to the first magnetic layer is smaller than the magnetization saturation magnetic field of the first magnetic layer,
    wherein residual magnetization M (emu/cc), film thickness h (nm), and length L ($\mu$m) of the second magnetic layer, and a magnetization saturation magnetic field Hs (Oe) of the first magnetic layer satisfy $M \times h/(75 \times L + 2.6) < Hs;$ a plurality of bit lines each connected to one terminal of a corresponding one of said memory elements;
    a plurality of write lines which cross said bit lines and serve as said magnetic field generation means for applying a magnetic field to said memory elements;
    memory element selection switching elements each connected to the other terminal of a corresponding one of said memory elements; and
    a plurality of sense amplifiers each of which has one terminal connected to a corresponding one of said bit lines and detects a resistance value of said memory element,
    wherein information is recorded by magnetic fields applied from said write and bit lines, and
    information is reproduced by applying a voltage to said bit line and inputting the resistance of said memory element to said sense amplifier.

13. An MRAM according to claim 12, wherein information is reproduced by comparing the resistance value of said memory element with a reference value input to the other terminal of said sense amplifier.

* * * * *

UNITED STATES PATENT AND TRADEMARK OFFICE
CERTIFICATE OF CORRECTION

PATENT NO. : 6,853,580 B2
DATED : February 8, 2005
INVENTOR(S) : Naoki Nishimura It is certified that error appears in the above-identified patent and that said Letters Patent is hereby corrected as shown below:

Column 1,
Line 26, "high-speed," should read -- a high-speed, --; and
Line 51, "in read." should read -- in a read --.

Column 12,
Line 13, "an" should read -- a --; and
Line 62, "Read of Information" should read -- An information read --.

Column 13,
Line 30, "form" should read -- from --; and
Line 39, "select" should read -- selected --.

Signed and Sealed this

Fourteenth Day of June, 2005

JON W. DUDAS
*Director of the United States Patent and Trademark Office*